United States Patent
Dupuy et al.

(10) Patent No.: US 11,670,724 B2
(45) Date of Patent: Jun. 6, 2023

(54) PHOTOVOLTAIC CELLS FOR A PORTABLE ELECTRONIC DEVICE

(71) Applicant: Garmin Switzerland GmbH, Schaffhausen (CH)

(72) Inventors: Lionel J. Dupuy, Pourrieres (FR); John M. Kenkel, Kansas City, KS (US)

(73) Assignee: Garmin Switzerland GmbH

( * ) Notice: Subject to any disclaimer, the term of this patent is extended or adjusted under 35 U.S.C. 154(b) by 59 days.

(21) Appl. No.: 17/203,996

(22) Filed: Mar. 17, 2021

(65) Prior Publication Data

US 2021/0296514 A1   Sep. 23, 2021

Related U.S. Application Data

(60) Provisional application No. 62/992,517, filed on Mar. 20, 2020.

(51) Int. Cl.
*H01L 31/042* (2014.01)
*H02S 10/00* (2014.01)
(Continued)

(52) U.S. Cl.
CPC .. *H01L 31/022425* (2013.01); *G02F 1/13324* (2021.01); *G02F 1/13338* (2013.01); *G04C 10/02* (2013.01); *H01L 31/042* (2013.01); *H01L 31/1804* (2013.01); *H01L 31/022475* (2013.01); *H01L 31/022483* (2013.01); *H01L 31/0504* (2013.01)

(58) Field of Classification Search
CPC ........... H01L 31/022425; H01L 31/042; H01L 31/1804; H01L 31/022475; H01L 31/022483; H01L 31/0504; H01L 31/0468; G02F 1/13324; G02F 1/13338; G04C 10/02; Y02E 10/547; H02S 20/30
See application file for complete search history.

(56) References Cited

U.S. PATENT DOCUMENTS

2005/0189014 A1   9/2005   Gaudiana et al.
2010/0079387 A1   4/2010   Rosenblatt et al.
(Continued)

FOREIGN PATENT DOCUMENTS

KR   1020130024647 A   3/2013
WO   WO-2012018194 A2 *   2/2012   ......... G02F 1/13306

OTHER PUBLICATIONS

English machine translation of WO 2012/018194 A2 (Year: 2022).*
(Continued)

*Primary Examiner* — Angelo Trivisonno
(74) *Attorney, Agent, or Firm* — Samuel M. Korte; Max M. Ali

(57) ABSTRACT

Systems and methods for generating electrical current from at least one photovoltaic cell is described herein. The photovoltaic cell may be disposed over a display of an electronic device. The photovoltaic cell may comprise first and second conductive layers and a photovoltaic layer. The first conductive layer may be etched such that a width of the metal layer is less than a width of the photovoltaic layer providing visibility to the display disposed below. In some embodiments, a capacitive touch sensor is disposed between the metal layer and the absorber layer for providing interaction with a user.

19 Claims, 9 Drawing Sheets

(51) Int. Cl.
*H01L 31/0224* (2006.01)
*G02F 1/133* (2006.01)
*G02F 1/1333* (2006.01)
*H01L 31/18* (2006.01)
*G04C 10/02* (2006.01)
*H01L 31/05* (2014.01)

(56) References Cited

U.S. PATENT DOCUMENTS

| | | | |
|---|---|---|---|
| 2011/0303266 A1* | 12/2011 | Chang | H01L 31/0684 |
| | | | 136/252 |
| 2013/0284231 A1 | 10/2013 | Stein | |
| 2014/0152632 A1* | 6/2014 | Shedletsky | H04N 5/58 |
| | | | 250/208.2 |
| 2018/0028133 A1 | 2/2018 | Jones et al. | |
| 2019/0384354 A1 | 12/2019 | Badinski et al. | |
| 2020/0124892 A1 | 4/2020 | Hanshew | |
| 2021/0088820 A1 | 3/2021 | Hanshew | |

OTHER PUBLICATIONS

U.S. Appl. No. 16/947,879, filed Aug. 21, 2020.
U.S. Appl. No. 17/204,013, filed Mar. 17, 2021.
U.S. Appl. No. 17/204,017, filed Mar. 17, 2021.
International Search Report and Written Opinion from PCT/US/2021/022759, dated Jul. 7, 2021.
International Search Report and Written Opinion from PCT/US/2021/022768, dated Jun. 21, 2021.
International Search Report and Written Opinion from PCT/US/2021/022771, dated Jun. 25, 2021.

* cited by examiner

PHOTOVOLTAIC CELLS FOR A PORTABLE ELECTRONIC DEVICE

RELATED APPLICATIONS

This non-provisional patent application claims priority benefit, with regard to all common subject matter, of earlier-filed U.S. Provisional Patent Application No. 62/992,517, filed Mar. 20, 2020, and entitled "IMPROVED PHOTOVOLTAIC." The identified earlier-filed provisional patent application is hereby incorporated by reference in its entirety into the present application.

BACKGROUND

Conventional wearable electronic devices, like smartwatches, GPS navigation devices, fitness trackers, etc. utilize touchscreens to provide a user interface to users of the electronic devices. Battery life is important for these devices as space is limited. The battery may need to be charged on a regular basis and it can be aggravating for users to stop wearing a device for recharging. Some attempts have been made to equip smartwatches with semitransparent solar panels such as by using a discrete solar cell positioned on top of (or over) the watch's display. Typically, this leads to decreased visibility or inefficiency of the system. Typically, the solar cells are disposed over the display thus limiting visibility to the display. This can be distracting for the user and is not aesthetically pleasing.

SUMMARY

Embodiments of the present invention provide a first embodiment directed to a photovoltaic power system for an electronic device, the photovoltaic power system comprising at least one photovoltaic cell comprising a first layer comprising a first conductive electrode, and a second layer electrically connected to the first layer and configured to generate electrical current when exposed to electromagnetic radiation, and a third layer comprising a second conductive electrode, wherein a first layer width is less than a second layer width.

A second embodiment is directed to a photovoltaic power system for an electronic device, the photovoltaic power system comprising a base layer comprising a touch sensor, at least one photovoltaic cell comprising a first layer comprising a first conductive electrode, and a second layer electrically connected to the first layer and configured to generate electrical current when exposed to electromagnetic radiation, and a third layer comprising a second conductive electrode, wherein a first layer width is less than a second layer width.

A third embodiment is directed to a photovoltaic power system for an electronic device, the photovoltaic power system comprising a base layer comprising at least one photovoltaic cell comprising a first layer comprising a first conductive electrode, and a second layer electrically connected to the first layer and configured to generate electrical current when exposed to electromagnetic radiation, a third layer comprising a second conductive electrode, wherein a first layer width is less than a second layer width, and at least one exterior photovoltaic cell disposed along a perimeter of the base layer.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 6:
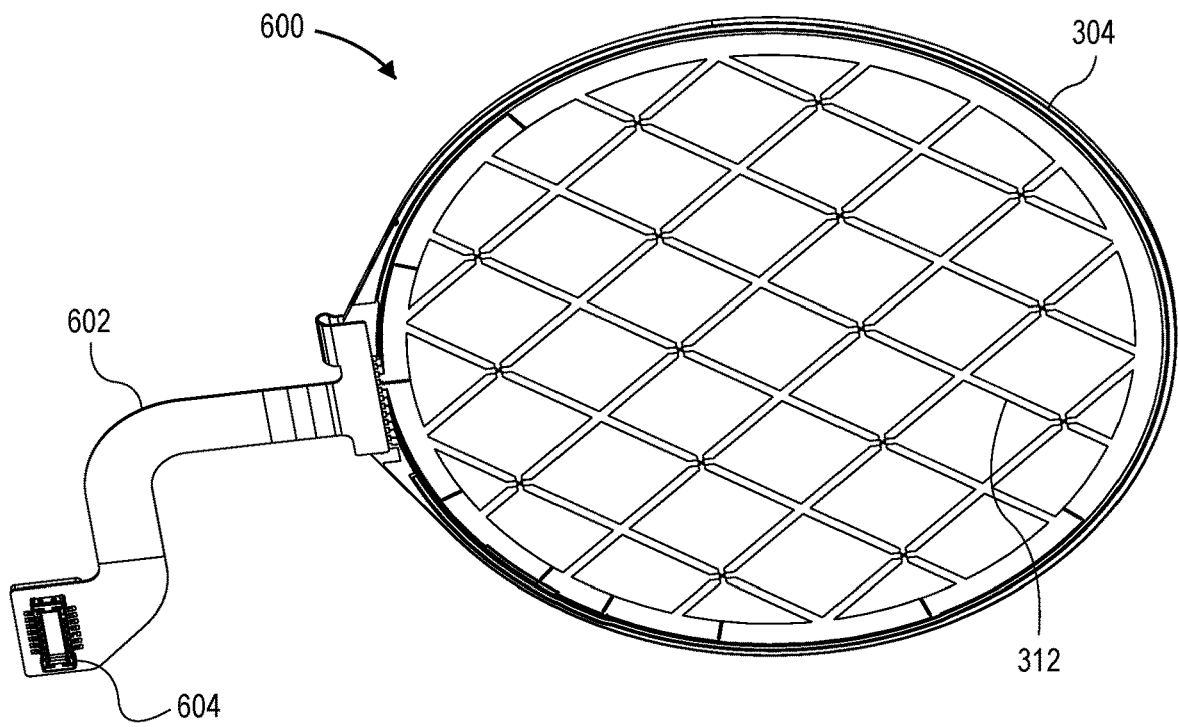
Figure 7:
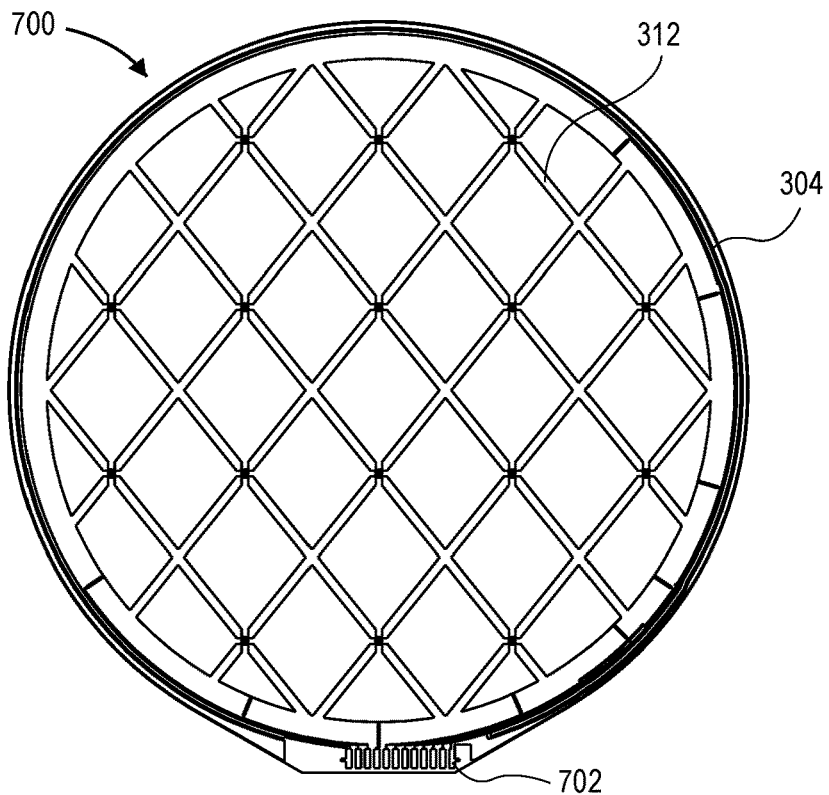
Figure 8:
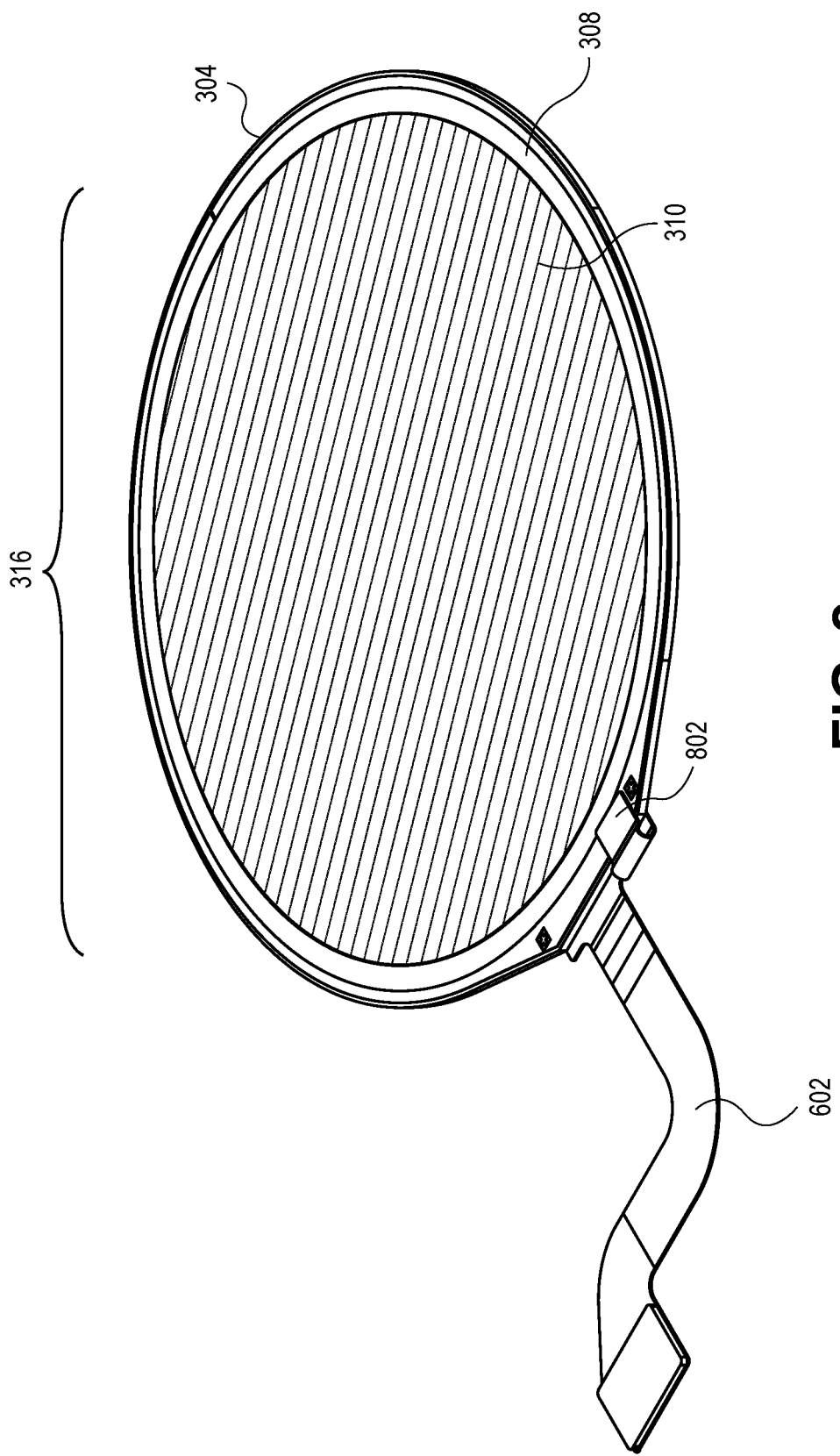
Figure 9:
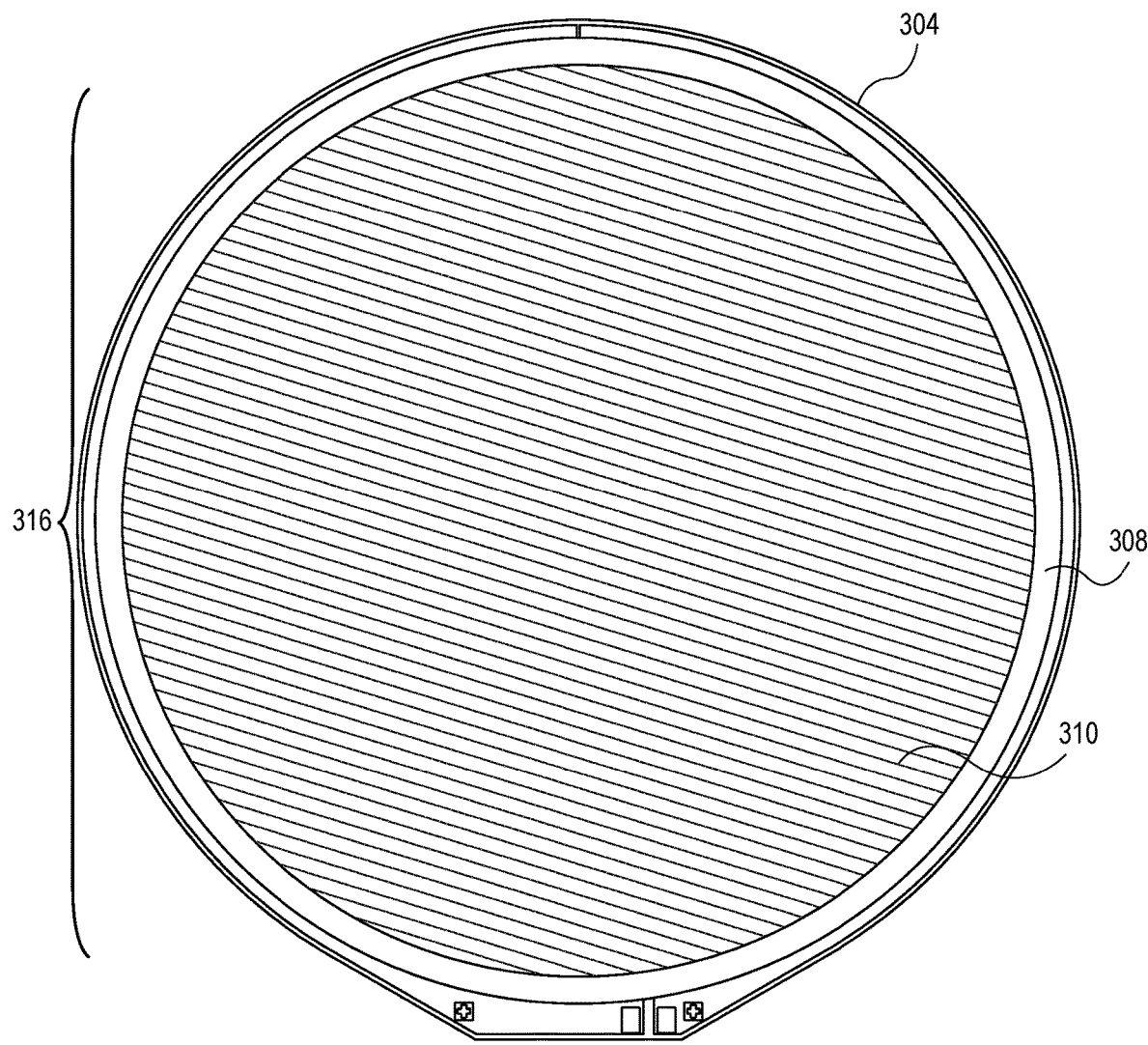

FIGS. 6 and 7 depict a touch sensor on a front face of the common base layer; and FIGS. 8 and 9 depict a photovoltaic surface comprising photovoltaic cells on a face of the common base layer of FIGS. 6 and 7.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

In general, embodiments of the invention are directed to systems and methods for providing improved photovoltaic cells that suitable for use in connection with an electronic device. The photovoltaic cells may be provided such that they have low visibility to a user yet are exposed to electromagnetic radiation and are sufficiently efficient to provide necessary power to run the electronic device. The photovoltaic cells may be configured to reduce visibility of the photovoltaic cell components to the user while increasing visibility of a display disposed behind the photovoltaic cells relative to the user. Typically, an electrode of a photovoltaic cell may be visible. In some configurations of the present invention, a photovoltaic stack may be provided in which the width of a metal electrode is less than the width of absorber layers for example, p-type, intrinsic, n-type (PIN) and less than the width of a transparent conductive oxide (TCO) layer such as aluminum-doped zinc oxide (AZO) layers. As the metal electrode is largely responsible for the lack of transparency in the photovoltaic stack, increasing the width of the absorber layers in comparison to the width of the metal electrode improves energy performance while providing similar, or even better, optical transparency. That is, the appearance of a transparent photovoltaic cell may be improved by decreasing the width of the metal electrode without decreasing the width of the absorber layer(s). This configuration may be used with single-cell photovoltaic implementations or with multi-cell photovoltaic implementations as described in connection with certain embodiments below.

Further, the photovoltaic cells may be disposed on the electronic device in such a way as to present low visibility while maintaining exposure to electromagnetic radiation. For example, the photovoltaic cells may be exposed around an outer edge of a display or in a specific pattern across a display of a portable electronic device. The specific pattern used, and the location of the photovoltaic cells may increase transparency while maintaining a high level of power generation.

Embodiments of the present invention may be employed with any photovoltaic cell configuration, such as for example, the configurations described in U.S. Patent Application Publication No. US20160126407A1, which is incorporated herein by specific reference. That is, differing electrode widths and absorber widths may be employed with any cell arrangement and not just the example arrangements illustrated herein. Additionally, absorbers of any configuration may be employed by embodiments of the present invention without limitation to the illustrated examples described herein.

Exemplary Environment

Figure 1:
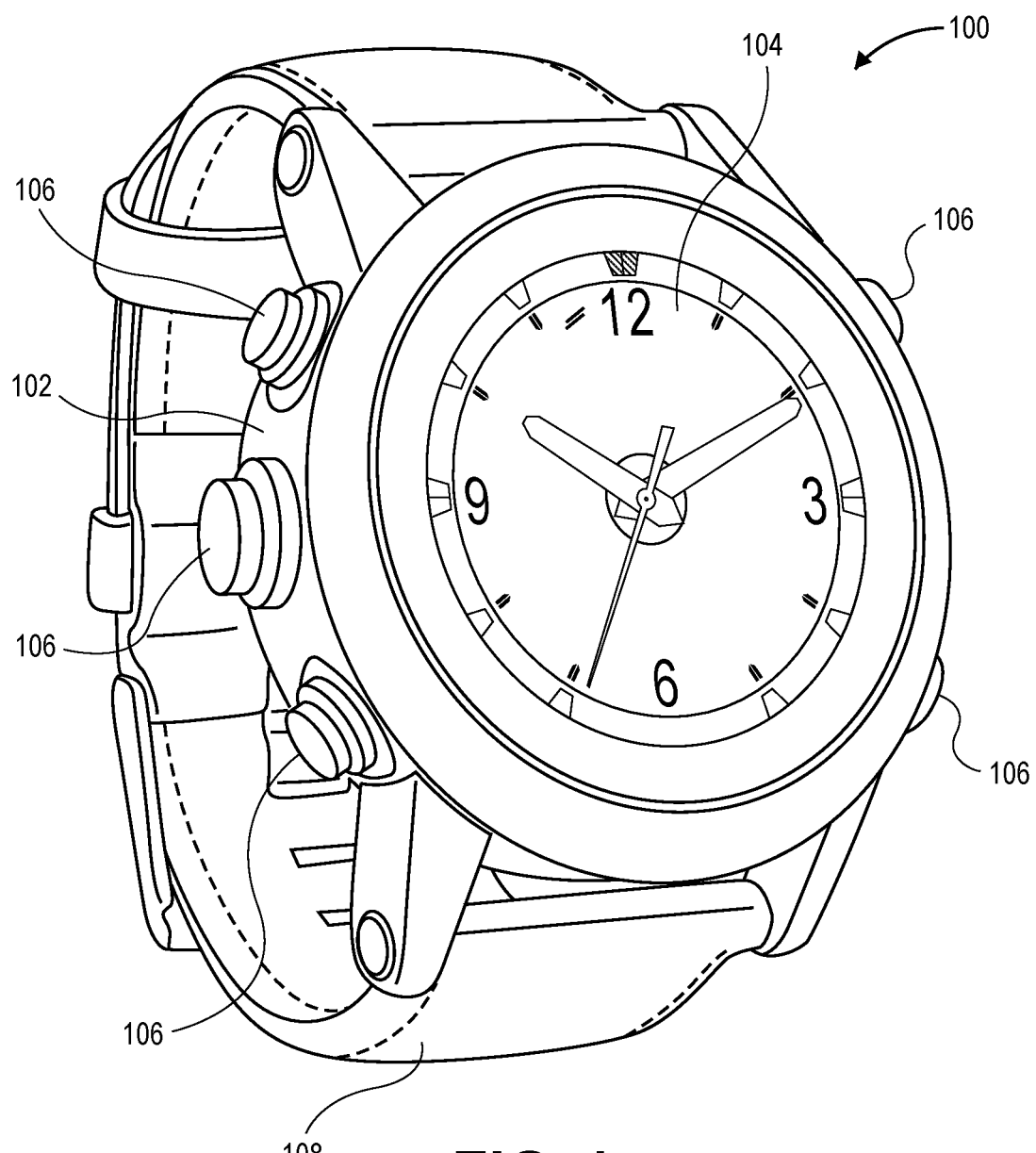
FIG. 1 depicts an exemplary electronic device for use with the embodiments of the invention.

FIG. 1 depicts a perspective view of a mobile electronic device (in this embodiment, a smartwatch 100) in accordance with one or more embodiments of the present disclosure. The photovoltaic cells, described below, may be configured to be disposed in, and power, the mobile electronic device. The exemplary smartwatch 100 may be operable to provide fitness information and/or navigation functionality to a user of the smartwatch 100. The smartwatch 100 may be configured in a variety of ways. For instance, the smartwatch 100 may be configured for use during fitness and/or sporting activities and comprise a cycle computer, a sport watch, a golf computer, a smart phone providing fitness or sporting applications (apps), a handheld GPS device used for hiking, and so forth. However, it is contemplated that the present teachings can be implemented in connection with any mobile electronic device. Thus, the mobile electronic device may also be configured as a portable navigation device (PND), a mobile phone, a handheld portable computer, a tablet computer, a personal digital assistant, a multimedia device, a media player, a game device, combinations thereof, and so forth. In the following description, a referenced component, such as mobile electronic device or specifically, smartwatch 100, may refer to one or more entities, and therefore by convention reference may be made to a single entity (e.g., the smartwatch 100) or multiple entities (e.g., the smartwatches 100, the plurality of smartwatches 100, and so on) using the same reference number. In some embodiments, the photovoltaic cells may provide power to run all components of the mobile electronic device.

The smartwatch 100 includes a housing 102. The housing 102 is configured to house, e.g., substantially enclose, various components of the smartwatch 100. The housing 102 may be formed from a lightweight and impact-resistant material such as metal or a metal alloy, plastic, nylon, or combinations thereof, for example. The housing 102 may be formed from a non-conductive material, such a non-metal material, for example. The housing 102 may include one or more gaskets, e.g., a seal, to make it substantially waterproof or water resistant. The housing 102 may include a location for a battery and/or another power source for powering one or more components of the smartwatch 100. The housing 102 may be a singular piece or may include a plurality of sections. In embodiments, the housing 102 may be formed from a conductive material, such as metal, or a semi-conductive material.

In various embodiments, the smartwatch 100 includes a viewing area 104. The viewing area 104 may include a liquid crystal display (LCD), a thin film transistor (TFT), a light-emitting diode (LED), a light-emitting polymer (LEP), and/or a polymer light-emitting diode (PLED). However, embodiments are not so limited. In various embodiments, the viewing area 104 includes one or more analog or mechanical presentation indicators, such as analog watch hands or mechanical complications or other mechanical gauge or dial indicators. In these embodiments, the viewing area 104 is used to display text and/or graphical information. The viewing area 104 may be backlit such that it may be viewed in the dark or other low-light environments. However, embodiments are not so limited. The viewing area 104 may be enclosed by a transparent lens or cover layer that covers and/or protects components of the smartwatch 100. The viewing area 104 may be backlit via a backlight such that it may be viewed in the dark or other low-light environments. The viewing area 104 may be provided with a touch screen to receive input (e.g., data, commands, etc.) from a user. For example, a user may operate the smartwatch 100 by touching the touch screen and/or by performing gestures on the screen. In some embodiments, the touch screen may be a capacitive touch screen, a resistive touch screen, an infrared touch screen, combinations thereof, and the like. The smartwatch 100 may further include one or more input/output (I/O) devices (e.g., a keypad, buttons, a wireless input device, a thumbwheel input device, a trackstick input device, and so on). The I/O devices may include one or more audio I/O devices, such as a microphone, speakers, and so on.

As noted above, in various embodiments, the smartwatch 100 includes one or more mechanical watch hands (e.g., hour hand, minute hand, second hand, and so on) or mechanical complications (date, calendar, dial indicator, and so on). These mechanical watch hands or mechanical complications may be driven by electric motors or other mechanical structures (e.g., spring, wheel, and so on).

The smartwatch 100 may also include a communication module representative of communication functionality to permit smartwatch 100 to send/receive data between different devices (e.g., components/peripherals) and/or over the one or more networks. The communication module may be representative of a variety of communication components and functionality including, but not limited to: one or more antennas; a browser; a transmitter and/or receiver; a wireless radio; data ports; software interfaces and drivers; networking interfaces; data processing components; and so forth. The smartwatch 100 may be configured to communicate via one or more networks with a cellular provider and an Internet provider to receive mobile phone service and various content, respectively. Content may represent a variety of different content, examples of which include, but are not limited to: map data, which may include route information; web pages; services; music; photographs; video; email service; instant messaging; device drivers; real-time and/or historical weather data; instruction updates; and so forth.

The one or more networks are representative of a variety of different communication pathways and network connections which may be employed, individually or in combinations, to communicate among various components. Thus, the one or more networks may be representative of communication pathways achieved using a single network or multiple networks. Further, the one or more networks are representative of a variety of different types of networks and connections that are contemplated including, but not limited to: The Internet; an intranet; a satellite network; a cellular network; a mobile data network; wired and/or wireless connections; and so forth. Examples of wireless networks include but are not limited to: networks configured for communications according to: one or more standard of the Institute of Electrical and Electronics Engineers (IEEE), such as 802.11 or 802.16 (Wi-Max) standards; Wi-Fi standards promulgated by the Wi-Fi Alliance; Bluetooth standards promulgated by the Bluetooth Special Interest Group; and so on. Wired communications are also contemplated such as through universal serial bus (USB), Ethernet, serial connections, and so forth.

In accordance with one or more embodiments of the present disclosure, the smartwatch 100 includes a control button 106. As illustrated in FIG. 1, the control button 106 is associated with, e.g., adjacent to, the housing 102. While FIG. 1 illustrates four control buttons 106 associated with the housing 102, embodiments are not so limited. For example, the smartwatch 100 may include fewer than four control buttons 106, such as one, two, or three control buttons. Additionally, the smartwatch 100 may include more than four control buttons 106, such as five, six, or seven, for example. The control button 106 is configured to control a function of the smartwatch 100. In various embodiments, regions of the viewing area of the smartwatch 100 are covered with a touch sensor as further described below in connection with FIGS. 3-9. In these embodiments, a touchscreen functions as a user interface component to provide input to the smartwatch 100, when a user touches various surface regions of the touchscreen associated with the smartwatch 100, which regions are configured to control a function of the smartwatch 100.

Figure 2:
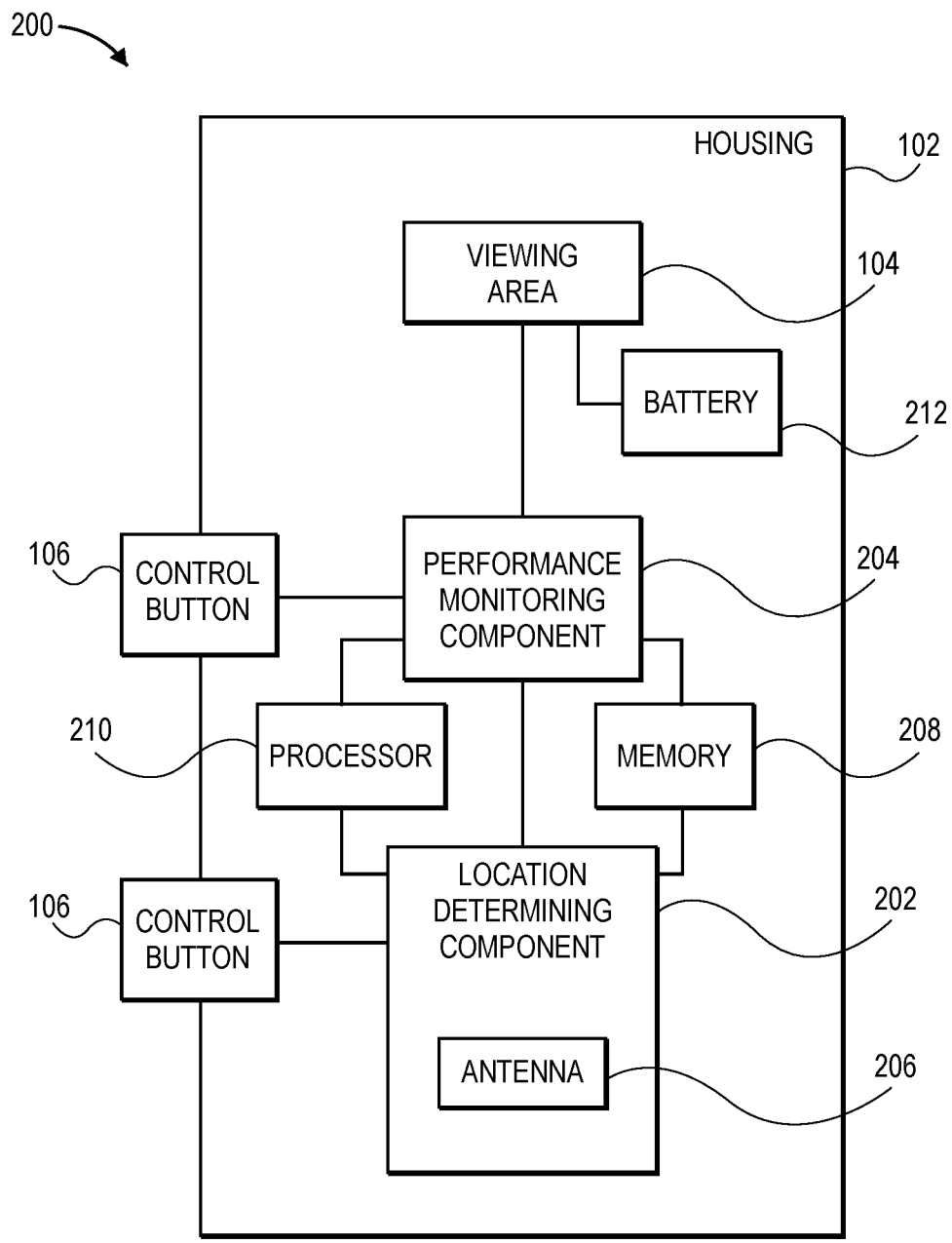
FIG. 2 depicts an exemplary hardware system for use with embodiments of the invention.

Functions of the smartwatch 100 may be associated with a location determining component 202 (FIG. 2) and/or a performance monitoring component 204 (FIG. 2). Functions of the smartwatch 100 may include, but are not limited to, displaying a current geographic location of the smartwatch 100, mapping a location in the viewing area 104, locating a desired location and displaying the desired location on the viewing area 104, monitoring a user's heart rate, monitoring a user's speed, monitoring a distance traveled, calculating calories burned, and the like. In embodiments, user input may be provided from movement of the housing 102. For example, an accelerometer may be used to identify tap inputs on the housing 102 or upward and/or sideways movements of the housing 102. In embodiments, user input may be provided from touch inputs identified using various touch sensing technologies, such as resistive touch or capacitive touch interfaces.

In accordance with one or more embodiments of the present disclosure, the smartwatch 100 includes a strap 108. As illustrated in FIG. 1, the strap 108 is associated with, e.g., coupled to, the housing 102. For example, the strap 108 may be removably secured to the housing 102 via attachment of securing elements to corresponding connecting elements. Examples of securing elements and/or connecting elements include, but are not limited to hooks, latches, clamps, snaps, and the like. The strap 108 may be made of a lightweight and resilient thermoplastic elastomer and/or a fabric, for example, such that the strap 108 may encircle a portion of a user without discomfort while securing the housing 102 to the user. The strap 108 may be configured to attach to various portions of a user, such as a user's leg, waist, wrist, forearm, and/or upper arm.

FIG. 2 shows a block diagram 200 of the internal components of an exemplary mobile electronic device such as the smartwatch 100 of FIG. 1, in accordance with various embodiments of the present disclosure. The housing 102 can include a location determining component 202 positioned within the housing. For example, the location determining component 202 may include an antenna 206 having a ground plane. The ground plane may be formed by coupling a printed circuit board and/or a conductive cage with the antenna 206. The antenna 206 and the ground plane may be coupled using solder, connection elements, or combinations thereof.

The location determining component 202 may be a GPS receiver that is configured to provide geographic location information of the watch. The location determining component 202 may be, for example, a GPS receiver such as those provided in various products by GARMIN®. Generally, GPS is a satellite-based radio navigation system capable of determining continuous position, velocity, time, and direction information. Multiple users may simultaneously utilize GPS. GPS incorporates a plurality of GPS satellites that orbit the earth. Based on these orbits, GPS satellites can relay their location to a GPS receiver. For example, upon receiving a GPS signal, e.g., a radio signal, from a GPS satellite, the watch disclosed herein can determine a location of that satellite. The watch can continue scanning for GPS signals until it has acquired a number, e.g., at least three, of different GPS satellite signals. The watch may employ geometrical triangulation, e.g., where the watch utilizes the known GPS satellite positions to determine a position of the watch relative to the GPS satellites. Geographic location information and/or velocity information can be updated, e.g., in real time on a continuous basis, for the watch.

The location determining component 202 may also be configured to provide a variety of other position-determining functionality. Location determining functionality, for purposes of discussion herein, may relate to a variety of different navigation techniques and other techniques that may be supported by "knowing" one or more positions. For instance, location determining functionality may be employed to provide position/location information, timing information, speed information, and a variety of other navigation-related data. Accordingly, the location determining component 202 may be configured in a variety of ways to perform a wide variety of functions. For example, the location determining component 202 may be configured for outdoor navigation, vehicle navigation, aerial navigation (e.g., for airplanes, helicopters), marine navigation, personal use (e.g., as a part of fitness-related equipment), and so forth.

Accordingly, the location determining component 202 may include a variety of devices to determine position using one or more of the techniques previously described.

The location determining component 202, for instance, may use signal data received via a GPS receiver in combination with map data that is stored in the memory to generate navigation instructions (e.g., turn-by-turn instructions to an input destination or point of interest), show a current position on a map, and so on. Location determining component 202 may include one or more antennas 206 to receive signal data as well as to perform other communications, such as communication via one or more networks. The location determining component 202 may also provide other positioning functionality, such as to determine an average speed, calculate an arrival time, and so on.

The location determining component 202 may include one or more processors, controllers, and/or other computing devices as well as a memory 208, e.g., for storing information accessed and/or generated by the processors or other computing devices. The processor may be electrically coupled with a printed circuit board and operable to process position determining signals received by the antenna 206. The location determining component 202, e.g., the antenna 206, is configured to receive position determining signals, such as GPS signals from GPS satellites, to determine a current geographic location of the watch. The location determining component 202 may also be configured to calculate a route to a desired location, provide instructions, e.g., directions, to navigate to the desired location, display maps and other information on the display, and to execute other functions, such as, but not limited to, those functions described herein.

The memory 208 may store cartographic data and routing used by or generated by the location determining component 202. The memory 208 may be integral with the location determining component 202, stand-alone memory, or a combination of both. The memory 208 may include, for example, a removable nonvolatile memory card, such as a TransFlash card. The memory 208 is an example of device-readable storage media that provides storage functionality to store various data associated with the operation of the smartwatch 100, such as the software program and code segments mentioned above, or other data to instruct the processor and other elements of the smartwatch 100 to perform the techniques described herein. A wide variety of types and combinations of memory may be employed. The memory 208 may be integral with the processor, stand-alone memory, or a combination of both. The memory 208 may include, for example, removable and non-removable memory elements such as RAM, ROM, Flash (e.g., SD Card, mini-SD card, micro-SD Card), magnetic, optical, USB memory devices, and so forth.

The antenna 206, for example, may be configured to receive and/or transmit a signal, such as a GPS signal. Antenna 206 may be any antenna capable of receiving wireless signals from a remote source, including directional antennas and omnidirectional antennas. Antenna 206 may include any type of antennas in which the length of the ground plane affects the efficiency of the antenna 206. In accordance with one or more embodiments of the present disclosure, the antenna 206 is an omnidirectional antenna having a ground plane. An omnidirectional antenna may receive and/or transmit in both orthogonal polarizations, depending upon direction. In other words, omnidirectional antennas do not have a predominant direction of reception and/or transmission. Examples of omnidirectional antennas include, but are not limited to, inverted-F antennas (IFAs) and planar inverted-F antennas (PIFAs). In contrast to omnidirectional antennas, directional antennas have a primary lobe of reception and/or transmission over an approximate 70 by 70-degree sector in a direction away from the ground plane. Examples of directional antennas include, but are not limited to, microstrip antennas and patch antennas.

In accordance with one or more embodiments of the present disclosure, the antenna 206 may be an embedded antenna. As used herein, an embedded antenna refers to an antenna that is positioned completely within a device housing. For example, the antenna 206 may be positioned completely within the housing 102. In some embodiments, the antenna 206 may be an external antenna with all or a portion of the antenna 206 exposed from the housing 102.

As discussed, the location determining component 202 includes the antenna 206. The antenna 206 may be associated with, e.g., formed on and/or within, an antenna support assembly. Alternatively, the antenna 206 may be positioned on a top portion or one or more side portions of the antenna support assembly.

The printed circuit board may support a number of processors, microprocessors, controllers, microcontrollers, programmable intelligent computers (PIC), field-programmable gate arrays (FPGA), other processing components, other field logic devices, application specific integrated circuits (ASIC), and/or the memory 208 that is configured to access and/or store information that is received or generated by the watch. The smartwatch 100 may implement one or more software programs to control text and/or graphical information on the display, as discussed herein. As an example, the printed circuit board may support the bottom portion of the antenna support assembly. In some embodiments, the antenna support assembly and antenna 206 may be positioned in the center of the top surface, bottom surface, or to a side of the of the printed circuit board.

A processor 210 may provide processing functionality for the smartwatch 100 and may include any number of processors, micro-controllers, or other processing systems, and resident or external memory for storing data and other information accessed or generated by the smartwatch 100. The processor 210 may execute one or more software programs that implement the techniques and modules described herein. The processor 210 is not limited by the materials from which it is formed, or the processing mechanisms employed therein and, as such, may be implemented via semiconductor(s) and/or transistors (e.g., electronic integrated circuits (ICs)), and so forth.

In accordance with one or more embodiments of the present disclosure, functions of the smartwatch 100 may be associated with the location determining component 202 and/or the performance monitoring component 204. For example, the location determining component 202 is configured to receive signals, e.g., position determining signals, such as GPS signals, to determine a position of the watch as a function of the signals. The location determining component 202 may also be configured to calculate a route to a desired location, provide instructions to navigate to the desired location, display maps and/or other information in the viewing area 104, to execute other functions described herein, among other things.

The performance monitoring component 204 may be positioned within the housing 102 and be coupled to the location determining component 202 and the viewing area 104. The performance monitoring component 204 may receive information, including, but not limited to geographic location information, from the location determining component 202, to perform a function, such as monitoring performance and/or calculating performance values and/or information related to a watch user's movement, e.g., exercise. The monitoring of the performance and/or the calculating performance values may be based at least in part on the geographic location information. The performance values may include, for example, a user's heart rate, speed, a total distance traveled, total distance goals, speed goals, pace, cadence, and calories burned. These values and/or information may be presented in the viewing area 104.

In embodiments, the smartwatch 100 includes a user interface, which is storable in the memory 208 and executable by the processor 210. The user interface is representative of functionality to control the display of information and data to the user of the smartwatch 100 in the viewing area 104. In some implementations, a display module within the viewing area 104 may not be integrated into the smartwatch and may instead be connected externally using universal serial bus (USB), Ethernet, serial connections, and so forth. The user interface may provide functionality to allow the user to interact with one or more applications of the smartwatch 100 by providing inputs via the touch screen and/or the I/O devices. For example, the user interface may cause an application programming interface (API) to be generated to expose functionality to an application to configure the application for display in the viewing area 104 or in combination with another display. In embodiments, the API may further expose functionality to configure the application to allow the user to interact with an application by providing inputs via the touch screen and/or the I/O devices. Applications may comprise software, which is storable in the memory 208 and executable by the processor 210, to perform a specific operation or group of operations to furnish functionality to the smartwatch 100. Example applications may include fitness application, exercise applications, health applications, diet applications, cellular telephone applications, instant messaging applications, email applications, photograph sharing applications, calendar applications, address book applications, and so forth.

In various embodiments, the user interface may include a browser. The browser enables the smartwatch 100 to display and interact with content such as a webpage within the World Wide Web, a webpage provided by a web server in a private network, and so forth. The browser may be configured in a variety of ways. For example, the browser may be configured as an application accessed by the user interface. The browser may be a web browser suitable for use by a full resource device with substantial memory and processor resources (e.g., a smart phone, a personal digital assistant (PDA), etc.). However, in one or more implementations, the browser may be a mobile browser suitable for use by a low-resource device with limited memory and/or processing resources (e.g., a mobile telephone, a portable music device, a transportable entertainment device, wristband, etc.). Such mobile browsers typically conserve battery energy, memory and processor resources, but may offer fewer browser functions than web browsers.

In various embodiments, the smartwatch 100 includes an energy storage device such as a battery 212. It is understood that this energy storage device could employ any conventional or later developed energy storage or chemical battery technology, such as a supercapacitor, for example employing electrostatic double-layer capacitance and electrochemical pseudocapacitance. In various embodiments the energy storage device or battery 212 includes a lithium polymer battery. As explained in connection with FIG. 1, in various embodiments, the control button 106 is configured to control a function of the smartwatch 100.

In some embodiments, the energy storage device is electrically connected to the photovoltaic cells described herein. The photovoltaic cells may provide power to charge the energy storage device. The photovoltaic cells may be connected directly to the energy storage device or through an intermediate processor for balancing the charge across a plurality of battery cells.

Figure 3:
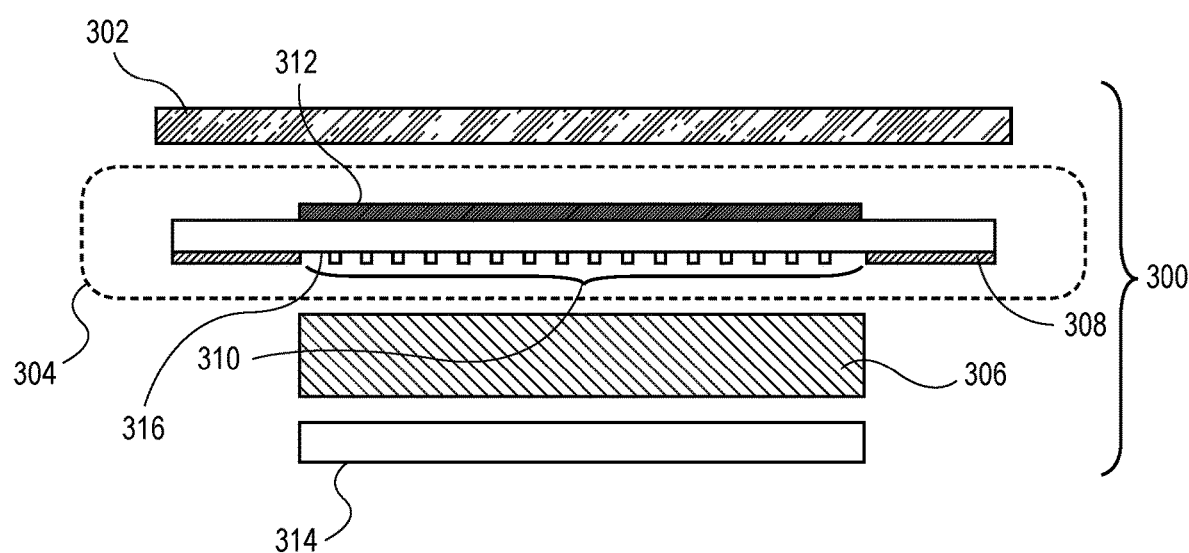
FIG. 3 depicts an exemplary embodiment of a various layers of an energy-collecting touchscreen unit.

FIG. 3 illustrates the various layers of an energy-collecting touchscreen unit 300 in accordance with an embodiment of the present disclosure. In various embodiments, a thin, substantially transparent lens or cover layer 302 is provided. A viewing area within the touchscreen unit can be observed through the cover layer 302, while the cover layer 302 protects the touchscreen unit 300 from physical damage. Moreover, in various embodiments extremely robust, scratch-resistant, and substantially transparent materials are employed, such as sapphire glass which is a synthetically produced crystal that is well-suited for use in touchscreens. In various alternate embodiments, the cover layer 302 is made of Gorilla Glass™ from Corning Incorporated from Corning, N.Y.

In various embodiments, a common base layer 304 is provided immediately beneath the cover layer 302. In various embodiments, an air gap between the cover layer 302 and the common base layer 304 is filled with a substantially transparent optical bonding agent. It is understood that the cover layer can be arbitrarily thin, integral to, and forming a part of the common base layer 304. In an embodiment, the common base layer 304 includes a touch sensor 312 that can be used to sense touch at the surface of the touchscreen unit 300. In various embodiments, the common base layer 304 is made of borosilicate glass. In an embodiment, the touch sensor is a capacitive touch panel ("CTP") made of a transparent conductive material such as indium tin oxide ("ITO") patterned in an array upon the upper face of the common base layer 304 and, in various embodiments, further processed to facilitate the electrical interconnections.

In various embodiments, the bottom face of the common base layer 304 includes materials which provide it with photovoltaic properties. In various embodiments, a photovoltaic surface 316 (as shown in FIGS. 8 and 9) is made up of an exterior portion 308 and an interior portion 310. The photovoltaic surface 316 is the surface of the common base layer 304 to which the interior portion 308 is applied. In an embodiment, the exterior portion 308 is substantially continuous, meaning that the exterior portion 308 is substantially intact and not etched. By contrast, in various embodiments, the interior portion 310 is photoetched away (as further described in reference to FIGS. 5A-5B, 6, and 7 described below) so that only a minor portion of the interior portion 310 actually covers the surface of the common base layer 304.

In some embodiments, display module 306 is provided beneath the common base layer 304. In various embodiments, the display module 306 is a liquid crystal pixel array having a pixel pitch of 126.9 micrometer with each pixel being made up of 9 apertures, 3 apertures for each color sub-pixel. In an embodiment, there is 5 micrometer gap between the apertures. In various embodiments, it is possible to superimpose 10 micrometer wide strips of photovoltaic material such that only 10% of the area of the display module 306 is blocked and the brightness and contrast of the display is only minimally impacted. In an embodiment, the strips of photovoltaic material are superimposed over the columns of the display pixels at a 25-degree tilt angle resulting in a minimal Moire consequence.

In various embodiments, the composite photovoltaic surface 316, which is made up of the exterior portion 308 and the interior portion 310, is circular or substantially congruent to the shape of the face of the smartwatch 100 or other portable electronic device. The photovoltaic surface is further shown in FIGS. 8 and 9 below. In various embodiments, the exterior portion 308 is made up of an annular ring of substantially continuous photovoltaic material along the distal perimeter of the display. Further, the interior portion 310 of photovoltaic material may be dispersed in a pattern across the interior portion 310 of the common base layer 304 so as to minimally obscure viewing of a viewing area within the touchscreen unit 300. The photovoltaic surface 316 is positioned on the bottom face of the common base layer 304 between the display module 306 and the common base layer 304. The touch sensor 312 is deposited upon the upper face of the common base layer 304. In various embodiments, a backlight 314 is provided so the display module 306 is visible in dark or relatively low-light environments.

Photovoltaic Cells

In some embodiments, the photovoltaic cells may be provided on the photovoltaic surface 316. The photovoltaic surface 316 may be disposed on the bottom face of the common base layer 304 between the display module 306 and the common base layer 304. Various embodiments of the photovoltaic cells and the photovoltaic cell configurations are provided in FIGS. 5A-9.

In configurations of the present invention, a photovoltaic stack may be provided in which the width of a metal electrode is less than the width of absorber (e.g., PIN and AZO) layers. As the metal electrode is largely responsible for the lack of transparency in the stack, increasing the width of the absorber layers in comparison to the width of the metal electrode improves energy performance while providing similar, or even better, optical visibility. That is, the appearance of a substantially transparent photovoltaic cell may be improved by decreasing the width of the metal electrode without decreasing the width of the absorber layer(s). This configuration may be used with single-cell photovoltaic implementations or with multi-cell photovoltaic implementations. In multi-cell implementations, some cells may employ a standard configuration where the widths of the various layers are generally equal, while other cells may employ the improved design where the width(s) of the absorber layer(s) are wider than the width of the metal electrode. To provide high efficiency between the cells, the cells may be electrically connected in series. In some embodiments, the multi-cell design may provide for the various photovoltaic cells to be connected in parallel. Consequently, when a photovoltaic cell is not receiving electromagnetic radiation, the other photovoltaic cells may still generate power. Such mixed usage allows the device to present any combination of desired performance and appearance.

Figure 4:
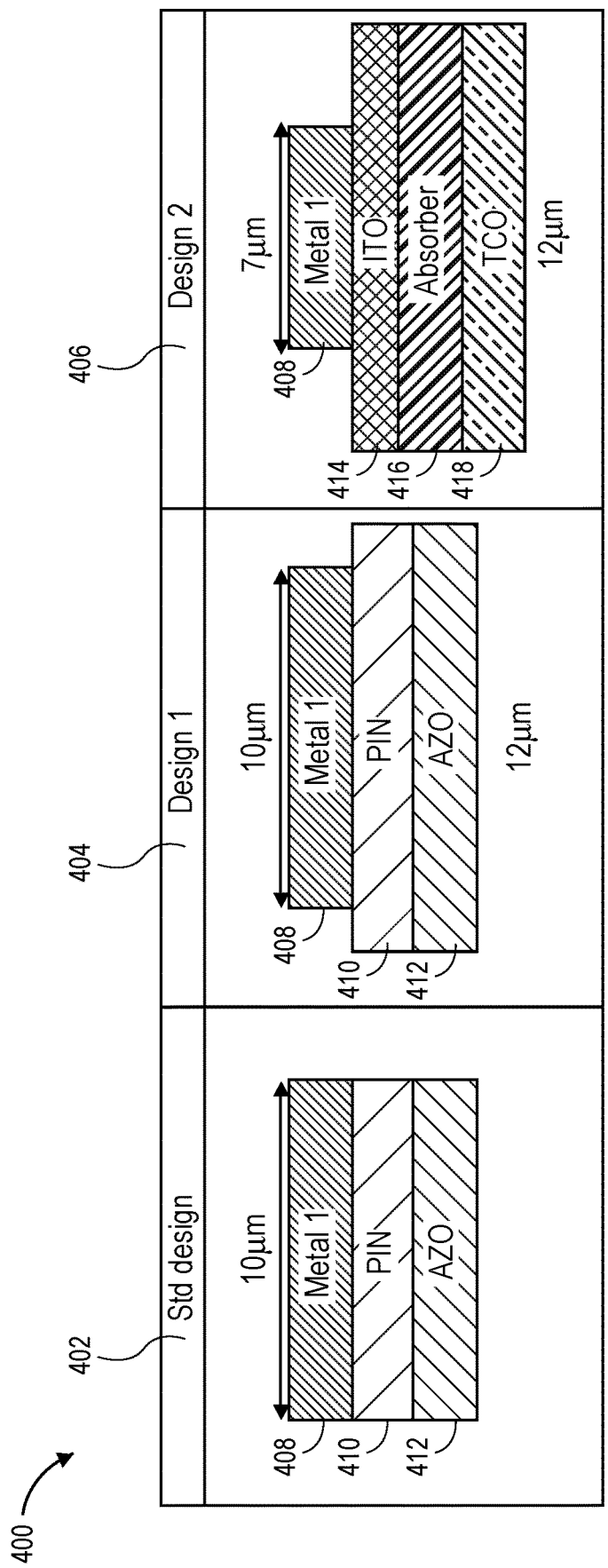
FIG. 4 depicts a table presenting embodiments of various photovoltaic cell designs.

FIG. 4 depicts a table presenting various photovoltaic cells generally referenced by the numeral 400. The various configurations of the photovoltaic cells comprise three designs, a standard design 402, a first design 404, and a second design 406. The photovoltaic cells may utilize a metal layer 408 which in some embodiments, may be an opaque or somewhat opaque metal electrode in combination with semitransparent absorber layers comprising PIN/AZO or the like.

In some embodiments, the standard design 402 comprises a metal layer 408, a PIN layer 410, and an AZO layer 412. In some embodiments, the PIN layer 410 and the AZO layer 412 may generally be referenced as absorber layers. In standard configurations, shown by the standard design 402, the width of each layer (metal layer 408, PIN layer 410, AZO layer 412) is substantially the same. Here, the exemplary width of 10 micrometers is shown.

In some embodiments, the metal layer 408 may comprise the electrode for moving current from the absorber layers to the electrical components of the electronic device. The metal layer 408 may comprise any conductive material such as, for example, aluminum, molybdenum, copper, zinc, nickel, graphite, carbon, titanium, brass, silver, gold, platinum and palladium, mixed metal oxide, and any alloy or combination thereof. The visibly restrictive metal electrode may be disposed on the absorber layers comprising the PIN layer 410 and the AZO layer 412.

In some embodiments, the absorber layers comprise the PIN layer 410 and the AZO layer 412. In some embodiments, the PIN layer 410 may comprise an amorphous silicon, a microcrystalline silicon, perovskites, or any other PV chemistries. The PIN layer provides a PIN junction for generating an electrical field with p-type and n-type regions with an intrinsic layer between. Any typical PIN junction may be used in embodiments described herein. In some embodiments, the AZO layer 412 comprises aluminum-doped zinc oxide. Though AZO is described in embodiments herein, any transparent or semitransparent conductive oxide film such as for example, indium and tin oxides may be used. Further, any organic, inorganic, and polymer may be used.

As shown in the standard design 402, the width of all layers (i.e., metal layer 408, PIN layer 410, and AZO layer 412) are substantially the same. The exemplary width of the three layers shown is 10 micrometers. However, any width may be used. As described above the metal layer 408 may be opaque, reflective, translucent, or provide visual obstruction such that visibility through the metal layer 408 to the display below is restricted. Reducing the width of the metal layer 408 increases visibility to the display disposed below the metal layer 408. The exemplary first design 404 is also presented in FIG. 4. The first design 404 presents the metal layer 408 as narrower than the absorber layers to increase visibility. The width of the metal layer 408 as shown is 10 micrometers and the width of the absorber layers is 12 micrometers. In some embodiments, the width of the metal layer may be 10 micrometers and the absorber layers may be 14 micrometers. These widths are exemplary, and any widths may be used. The width difference between the metal layer 408 and the absorber layers may be any ratio that both increases visibility and provides efficient energy production.

In some embodiments, the width of the metal layer 408 may be optimized based on visibility and efficiency. The narrower the metal layer 408 the higher visibility beyond the metal layer 408 to the display below. Therefore, for aesthetic purposes, it may be desirable to have the metal layer 408 as narrow as possible. However, the metal layer 408 is a conductor and the narrower the metal layer 408, the higher the electrical resistance. If the metal layer 408 is too narrow, the metal layer 408 may heat up, thereby experiencing thermal stress, and even potential failure. Therefore, there is a trade-off between visibility and efficiency of the photovoltaic cells.

Further, the width of absorber layers provides various efficiencies based on the width that must be taken into account when changing the width of the metal layer 408. The absorber layers may begin to lose efficiency at due to the width of the absorber without metal. However, the second design described below resolves this issue. Consequently, the permissible widths of absorber layers also are constrained. Absorber layer width test results are provided in the table below.

|  | Active area (cm$^2$) | Power (1 sun) | Win Power (%) |
|---|---|---|---|
| absorber 10 μm | 2.12E−04 | 18.90 |  |
| absorber 11 μm | 2.21E−04 | 19.69 | 4% |
| absorber 12 μm | 2.29E−04 | 20.47 | 8% |
| absorber 13 μm | 2.38E−04 | 21.24 | 12% |
| absorber 14 μm | 2.47E−04 | 22.02 | 16% |
| absorber 15 μm | 2.55E−04 | 22.78 | 21% |

A width ratio between the metal layer 408 and the absorber layers may be optimized based on a desired visibility and the efficiency of the photovoltaic cell. For example, the layers may be optimized simultaneously. The metal layer 408 width may be optimized based on visibility and efficiency and the absorber layer 416 may be optimized based on efficiency. The optimization may be performed simultaneously such that any effects from changes to the metal layer 408 on the absorber layers and vice versa may be captured. In some embodiments, the metal layer 408 width is 10 micrometers, and the width of the absorber layers is approximately 14 micrometers. In some embodiments metal layer width is between 3 and 11 micrometers and the absorber layer is between 9 and 31 micrometers. Any width combination may be determined through the optimization analysis and may be applied to the first design 404 and the second design 406.

Any varying combination of widths may be utilized that achieve the desired balance of energy performance and visibility. In one combination, the absorber layers (PIN/AZO) are provided a width of about 13 μm while the metal electrode presents a width of 10 micrometers. Such a configuration provides a power gain of about 14% without substantially decreasing display visibility. In some embodiments, two lithography masks may be employed to deposit the layers (a first mask for the metal electrode, a second for the absorber layer(s)) to enable the configurations described herein. The lithography masking and etching process for producing the various photovoltaic cells is shown in FIGS. 5A-5B and described in detail below.

The second design 406 also comprises the metal layer 408 and the absorber layers. Here, the absorber layer 416 may include both PIN and AZO or just PIN as a front contact is provided in a Transparent Conductive Oxide (TCO) layer 418 that may comprise AZO. The TCO layer 418 may provide additional electrode layers for greater efficiency. In some embodiments, a reflective material may be provided on a side of the TCO layer 418 opposite the incoming electromagnetic radiation to reflect the electromagnetic radiation back through the absorber layers to further increase efficiency. The second design also comprises an Indium Tin Oxide (ITO) layer 414 disposed between the metal layer 408 and the absorber layer 416.

In some embodiments, the ITO layer 414 comprises a patterned array to provide a capacitive touch sensor or capacitive touch panel (CTP) as described herein. The ITO layer 414 may be indium tin oxide or any other conductive oxide, organic, inorganic, or any other material that may be used as a CTP. The ITO layer 414 may be disposed at or near a top portion of the common base layer 304 and be electrically interconnected to provide touchscreen capabilities. The ITO layer 414 may detect variations in capacitance near the ITO layer 414. The ITO layer 414 may be the same width as the absorber layers. The ITO layer 414 is further described in embodiments below. Further, the TCO layer 418 may be the front contact provided by the AZO layer 412 as described above. In some embodiments, the TCO layer 418 may be the AZO layer 412. The layers of the second design 406 may be masked and etched using the lithography techniques described below.

Figure 5A:
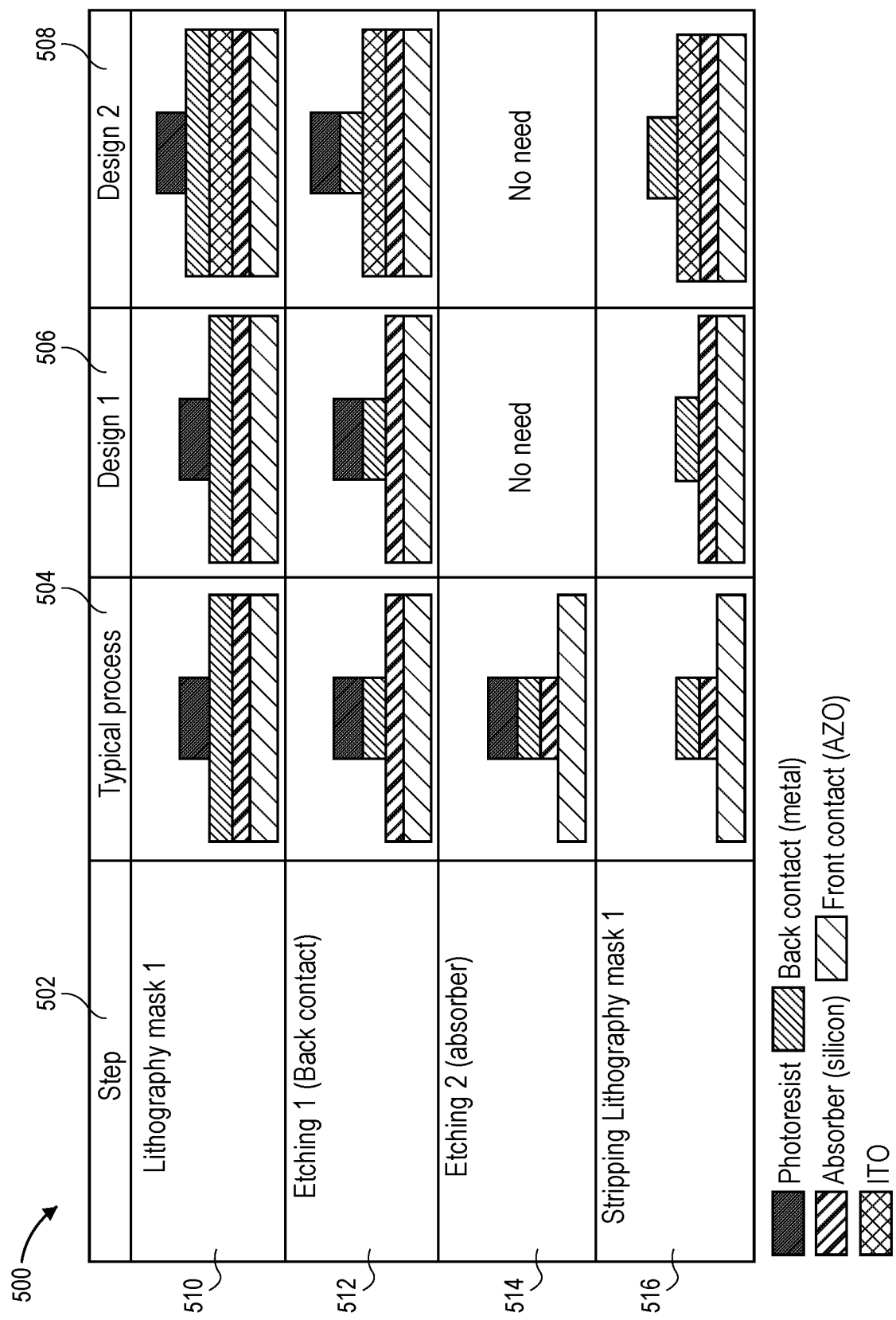
FIGS. 5A-5B depict an exemplary process of producing the photovoltaic cells of FIG. 4.
Figure 5B:
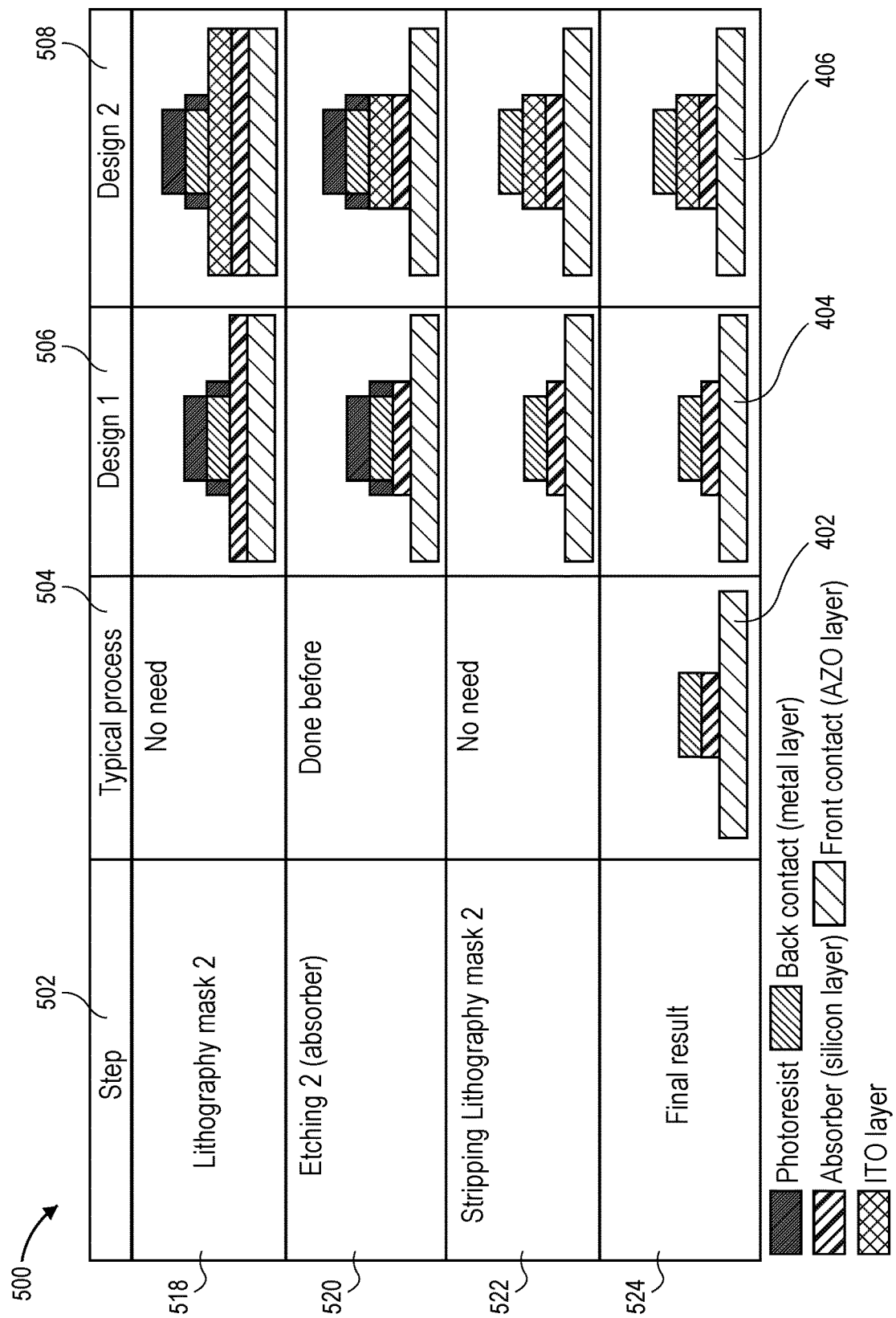

FIGS. 5A-5B depict an exemplary process for etching layers for producing the photovoltaic cells generally referenced by the numeral 500. The steps 502 are presented for the typical process 504 that may result in the standard design 402, the first design process 506, and the second design process 508. Prior to the etching process, the various layers are stacked. For example, the standard design 402 and the first design 404 comprise the metal layer 408, the PIN layer 410, and the AZO layer 412. The second design 406 comprises the metal layer 408, the ITO layer 414, the absorber layer 416, and the TCO layer 418 where, in some embodiments, the absorber layer 416 may be the PIN layer 410 and the TCO layer 418 may be the AZO layer 412.

At step 510, a first lithography mask is provided for etching. A photoresistive material is provided on the photovoltaic cells to mask the portions of material that require no etching. Here, the photoresistive material is substantially the width of the desired width of the metal layer 408 after etching. Therefore, the material that is masked by the photoresistive material is not removed. During the etching process the material that is not masked is removed and only the material that is masked remains. When the photoresistive material is in place, the process moves to step 512.

At step 512, the back contact material is etched. In this case, the back contact material is the metal layer 408. In the standard design 402, the metal layer 408 is etched to a width that will also be provided to the absorber layers. The first design 404 and the second design 406 may be etched to a width based on the width optimization described above. In some embodiments, the metal layer 408 of the first design 404 and the second design 406 may be different from the standard design 402. Any combination of widths of the metal layer 408 and the absorber layers may be provided on the various photovoltaic cells. At this point, the etching of the second design process 508 is finished. The width of the metal layer 408 is etched to the desired width and the subsequent layers are left.

At step 514, a second etching process is provided with the same photoresistive mask placement as above. The standard design 402 is the only design where the PIN layer 410 is the same width as the metal layer 408. As such, the second etching process with the same width photoresistive mask as the first etching is only applied to the standard design 402.

At step 516, a stripping operation is performed of the lithography mask 1 from the standard design 402, the first design 404, and the second design 406, to expose the metal layer 408 and the PIN layer 410. At this point, the typical process 504 to create the standard design 402 is complete. The metal layer 408 and the PIN layer 410 were both etched to the same width. The first design process 506 and the second design process 508 continue on FIG. 5B and described below.

At step 518, lithography mask 2 is applied to the first design 404 and the second design 406. The photoresistive mask is applied over and to the sides of the metal layer 408 to protect the metal layer 408 and the covered sections of the PIN layer 410 from etching. The PIN layer 410 is masked to provide a width greater than the width of the metal layer 408. Next, at step 520, the first design 404 is etched. The photoresistive mask blocks the photoetching and the unblocked portion of the PIN layer 410 is removed.

Further at step 520 the ITO layer 414 and absorber layer 416 may be removed using chemical products. The ITO layer 414 may be removed first with a first chemical. The absorber layer 416 may be removed second with a second chemical. In some embodiments, masks may be provided to protect the materials that are not etched from the first and second chemicals during the etching process. At step 522, the lithography masks are stripped revealing the final result.

At step 524, the final results are presented. The final result of the typical process 504 is the standard design 402 where the metal layer 408 is substantially the same width as the absorber layers. This provides a highly efficient power generation process with a low display visibility relative to the other processes. The final result of the first design process 506 is the first design 404. As described above, the first design 404 presents the metal layer 408 width narrower than the absorber layers. The first design 404 results in a higher display visibility with an increase in efficiency or at least without a substantial loss in efficiency. The trade-off between visibility and efficiency may be optimized as described above. The second design process 508 results in the second design 406. The second design 406 presents the metal layer 408 width narrower than the absorber layers width with the ITO layer 414 disposed between.

In some embodiments, the photovoltaic cells may be provided independently of any electronic device. The photovoltaic cells may be configured in an array with a pin out for connecting to a printed circuit board PCB or may be provided with a PCB that may be compatible with charging any energy storage device. As such, the photovoltaic cells may be generic to any electronic device such that the photovoltaic cells may be adaptable to connecting to, and powering, various electronic devices.

FIGS. 6 and 7 illustrate a touch sensor 312 on a front face of the common base layer 304, in accordance with various embodiments of the present disclosure with a flexible printed circuit cable 602 generally referenced by the numeral 600 and without the flexible printed circuit cable 602 generally reference by the numeral 700. In various embodiments the touchscreen aspect of the portable electronic device is provided as by means of the CTP made up of the ITO array on the upper surface of the common base layer 304 shown in FIG. 6. Additionally, a flexible printed circuit cable 602 is provided with connector 604 that can be connected to electronics associated with the smartwatch 100 such as the performance monitoring component 204 as shown in FIG. 2.

In various embodiments, contact pads made from ITO are provided on the glass surface for electrically interconnecting with the flexible printed circuit cable 602. In various embodiments, contact pads 802 made of plated copper are provided on the flexible printed circuit cable 602 to facilitate this electrical interconnection. In various embodiments, anisotropic conductive film ("ACF") material which acts like a conductive glue is provided to bond the glass to the flexible printed circuit cable 602. In various embodiments, the CTP array works by sensing differences in capacitance between the ITO areas of the touch sensor 312 of FIGS. 6 and 7. The flexible printed circuit cable 602 includes the connector 604 in such a way that the flexible printed circuit cable 602 can conveniently be folded under the common base layer 304 and plugged into the electronics of the smartwatch 100 before the housing 102 (of FIG. 1) is sealed closed. In various embodiments, the CTP of the top face of the common base layer 304 is either affixed to the cover layer 302 or in very close proximity. In order to improve capacitive touch sensitivity, the distance between the ITO touch sensor (the indium tin oxide pattern on the glass) and the touching object being sensed (e.g., a human finger) is minimized. Additionally, sensitivity is enhanced by minimizing a dielectric constant of the materials in that gap. In various embodiments, for a wearable application such as the smartwatch 100, the touch sensor 312 can sense through air gaps between a lens or similar cover layer 302. It is understood that the touch sensor 312 operates sub-optimally through layers that are conductive or hold an electrical charge. Where an electrical charge builds up on the cover layer 302, with for example an additional anti-glare coating (not shown), the touch sensor 312 may fail to operate properly when exposed to direct sunlight, for which reason, consistent with the present teachings, materials are selected that do not hold a substantial electrical charge.

As described above, capacitive touch sensitivity is increased by minimizing the dielectric constant of the combination of materials between the touch sensor 312 and the object being sensed (typically a finger). By way of reference the dielectric constant of ambient air is approximately 1.0 (relative permittivity), while sapphire is about 10 and glass is about 5, with conductive metals having a dielectric constant that is basically infinite. Accordingly, it is understood that, while glass, such as borosilicate glass, allows for greater touch sensitivity than some harder materials, it lacks the protective qualities of sapphire. Accordingly, a material for cover layer 302 is selected to provide the most physical protection while still providing adequate touch sensitivity. In this way, a position at which a finger or other capacitive pointing device touches the surface of the cover layer 302 can be accurately determined by changes in the capacitance measured in the ITO pattern and transmitted to various pins of a connector 604.

FIGS. 8 and 9 illustrate the photovoltaic surface 316 on a front face of the common base layer 304, in accordance with various embodiments of the present disclosure. In various embodiments, the photovoltaic surface 316 is formed from one or more layers of doped amorphous silicon which has the advantages of low cost as well as low toxicity compared to some other photovoltaic materials, but it is understood that other photovoltaic materials may be employed without departing from the present teachings. In various embodiments the pattern of the interior portion 310 of the photovoltaic surface 316 is formed by first depositing a substantially uniform layer or layers of photovoltaic material and then removing desired portions of the material by way of photoetching as described above in FIGS. 5A-5B.

In various embodiments, photovoltaic energy is transmitted through the cover layer 302 and the ITO array of touch sensor 312 (as well as the common base layer 304) into the photovoltaic layer. The photovoltaic layer is made up of the exterior portion 308 and the interior portion 310 of the photovoltaic surface 316 comprising the photovoltaic cells. The photovoltaic cells then generate electrical current and, therefore, energy in the photovoltaic layer which is then collected by way of conductors at tab 702 and through the flexible printed circuit cable 602 to be stored in an energy storage device as described in connection with the battery 212 of FIG. 2. Tab 702 is bonded to the common base layer 304 with ACF to provide an electrical interconnection to the flexible printed circuit cable 602. In some embodiments, the photoelectric cells provided on the photovoltaic surface may be any of the above-described photovoltaic cell designs. The photovoltaic cells may be any one or combination of the standard design 402, the first design 404, and the second design 406.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A photovoltaic power system for an electronic device, the photovoltaic power system comprising:
   a capacitive touch panel comprising an indium tin oxide array configured to detect variations in capacitance; and
   at least one photovoltaic cell comprising:
      a first layer comprising a first conductive electrode; and
      a second layer electrically connected to the first layer and configured to generate electrical current when exposed to electromagnetic radiation; and
      a third layer comprising a second conductive electrode,
   wherein a first layer width is less than a second layer width; and
   wherein the capacitive touch panel is disposed between the first layer and the second layer.

2. The photovoltaic power system of claim 1,
   wherein the first layer width is between four and ten micrometers,
   wherein the second layer width is between ten and fifteen micrometers, and
   wherein the first conductive electrode comprises at least one of microcrystalline silicon, amorphous silicon, and perovskites for generating the electrical current.

3. The photovoltaic power system of claim 1,
   wherein the first layer width is ten micrometers, and
   wherein the second layer width is fourteen micrometers.

4. The photovoltaic power system of claim 1,
   wherein the first layer width is seven micrometers, and
   wherein the second layer width is ten micrometers.

5. The photovoltaic power system of claim 1, wherein the at least one photovoltaic cell is a first photovoltaic cell; and
   further comprising a second photovoltaic cell comprising:
      a third layer comprising a second metal electrode; and
      a fourth layer electrically connected to the third layer and configured to generate electrical current when exposed to electromagnetic radiation,
      wherein a third layer width is greater than the first layer width, and
      wherein the first photovoltaic cell and the second photovoltaic cell are electrically connected in series.

6. The photovoltaic power system for claim 1, further comprising:
   an interior portion comprising the at least one photovoltaic cell; and
   an exterior portion comprising an exterior photovoltaic cell disposed around an outer edge of the interior portion.

7. The photovoltaic power system for claim 1, wherein the photovoltaic power system is configured to be connected to and provide power to at least one of a wearable and a handheld electric device.

8. A photovoltaic power system for an electronic device, the photovoltaic power system comprising:
   a base layer comprising:
      a capacitive touch sensor comprising an indium tin oxide array configured to detect variations in capacitance; and
      at least one photovoltaic cell comprising:
         a first layer comprising a first conductive electrode; and
         a second layer electrically connected to the first layer and configured to generate electrical current when exposed to electromagnetic radiation; and
         a third layer comprising a second conductive electrode,
   wherein a first layer width is less than a second layer width; and
   wherein the capacitive touch sensor is disposed between the first layer and the second layer.

9. The photovoltaic power system of claim 8,
   wherein the second layer width is between ten and fifteen micrometers, and
   wherein the first layer width is between four and ten micrometers.

10. The photovoltaic power system of claim 8,
    wherein the first layer width is seven micrometers, and
    wherein the second layer width is ten micrometers.

11. The photovoltaic power system for claim 8, further comprising:
    an interior portion comprising the at least one photovoltaic cell and a second photovoltaic cell,
    wherein the second photovoltaic cell comprises a metal electrode layer comprising a width greater than the first layer width; and
    an exterior portion comprising at least one exterior photovoltaic cell disposed around an outer edge of the interior portion.

12. The photovoltaic power system for claim 8, wherein the base layer is configured to be disposed above a liquid-crystal display and patterned to provide minimal visual obstruction of the liquid-crystal display.

13. The photovoltaic power system for claim 8, wherein the first conductive electrode comprises at least one of microcrystalline silicon, amorphous silicon, and perovskite for generating the electrical current.

14. A photovoltaic power system for an electronic device, the photovoltaic power system comprising:
    a base layer comprising:
       a capacitive touch panel comprising an indium tin oxide array configured to detect a variation in capacitance; and
       at least one photovoltaic cell comprising:
          a first layer comprising a first conductive electrode; and
          a second layer electrically connected to the first layer and configured to generate electrical current when exposed to electromagnetic radiation;
          a third layer comprising a second conductive electrode;
    wherein a first layer width is less than a second layer width;
    wherein at least one exterior photovoltaic cell disposed along a perimeter of the base layer; and
    wherein the capacitive touch panel is disposed between the first layer and the second layer.

15. The photovoltaic power system of claim 14,
    wherein the first layer width is between four and ten micrometers, and
    wherein the second layer width is between ten and fifteen micrometers.

16. The photovoltaic power system of claim 14,
    wherein the first layer width is ten micrometers, and
    wherein the second layer width is thirteen micrometers.

17. The photovoltaic power system for claim 14, wherein the base layer is configured to be disposed above a liquid crystal display and patterned to provide minimal visual obstruction of the liquid crystal display.

18. The photovoltaic power system for claim 14,
wherein the indium tin oxide array is further configured to transmit a signal indicative of a location of the variation in capacitance,
wherein the first conductive electrode comprises at least one of microcrystalline silicon, amorphous silicon, and perovskite for generating the electrical current, and
wherein the second conductive electrode is a metal electrode.

19. The photovoltaic power system for claim 14, wherein the at least one photovoltaic cell and the at least one exterior photovoltaic cell are configured to provide power for a global positioning satellite receiver and an accelerometer, and the electronic device is at least one of a watch, a wristband, and a handheld device.

\* \* \* \* \*